United States Patent
Bergljung et al.

(10) Patent No.: US 8,223,863 B2
(45) Date of Patent: Jul. 17, 2012

(54) METHOD AND ARRANGEMENT IN A CELLULAR COMMUNICATIONS SYSTEM

(75) Inventors: Christian Bergljung, Lund (SE); Ming Chen, Sollentuna (SE); Muhammad Kazmi, Bromma (SE); Olav Queseth, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 12/990,502

(22) PCT Filed: Dec. 18, 2008

(86) PCT No.: PCT/SE2008/051494
§ 371 (c)(1),
(2), (4) Date: Oct. 30, 2010

(87) PCT Pub. No.: WO2009/148372
PCT Pub. Date: Dec. 10, 2009

(65) Prior Publication Data
US 2011/0051829 A1    Mar. 3, 2011

Related U.S. Application Data

(60) Provisional application No. 61/059,165, filed on Jun. 5, 2008.

(51) Int. Cl.
*H04K 1/10* (2006.01)
(52) U.S. Cl. ............................ 375/260; 375/268; 455/59
(58) Field of Classification Search ................... 375/260
See application file for complete search history.

(56) References Cited

U.S. PATENT DOCUMENTS

| | | | |
|---|---|---|---|
| 6,430,402 B1* | 8/2002 | Agahi-Kesheh | 455/115.3 |
| 6,625,227 B1 | 9/2003 | Shull et al. | |
| 7,031,677 B2* | 4/2006 | Wenzel et al. | 455/127.2 |
| 7,158,494 B2* | 1/2007 | Sander et al. | 370/329 |
| 7,864,885 B2* | 1/2011 | Cleveland et al. | 375/316 |
| 7,907,674 B2* | 3/2011 | Kasami | 375/260 |
| 7,962,108 B1* | 6/2011 | Khlat et al. | 455/114.3 |
| 7,962,109 B1* | 6/2011 | Stockstad et al. | 455/115.1 |
| 7,986,738 B2* | 7/2011 | Sankabathula et al. | 375/260 |
| 2004/0208157 A1 | 10/2004 | Sander et al. | |
| 2007/0230616 A1* | 10/2007 | Zolfaghari et al. | 375/297 |
| 2008/0070510 A1* | 3/2008 | Doppler et al. | 455/69 |
| 2008/0280575 A1* | 11/2008 | Pesola | 455/127.1 |
| 2009/0066157 A1* | 3/2009 | Tarng et al. | 307/31 |

OTHER PUBLICATIONS

International Search Report for PCT/SE2008/051494 mailed Apr. 17, 2009.
International Preliminary Report on Patentability for PCT/SE2008/051494 dated Aug. 10, 2010.

(Continued)

*Primary Examiner* — Chieh M Fan
*Assistant Examiner* — Santiago Garcia (57) ABSTRACT

The present invention relates to the area of wireless communication, and especially to a method and an arrangement for transmission output power control in a cellular telecommunications network. An improved transmission output power control is achieved by adapting a pre-defined power mask to a signal transmission characteristic of the signal transmission and applying the adapted power mask to a sub-frame or an OFDM symbol. The present invention could be implemented in a network node such as an eNodeB or in a user equipment.

30 Claims, 12 Drawing Sheets

OTHER PUBLICATIONS

European Telecommunications Standards Institute, "Digital Cellular Telecommunications System (Phase 2+); Radio Transmission and Receipt (GSM 05.05 version 5.8.0); Draft pr ETS 300 910," vol. SMG2, Fifth Edition, May 1998, pp. 1-49, Cedex, France.

3GPP, "3rd Generation Partnership Project; Technical Specification Group Radio Access Network; User Equipment (UE) Radio Transmission and Reception (FDD) (Release 9)," 3GPP TS 25.101 v9.5.0, Sep. 2010, pp. 1-246.

3GPP, "3rd Generation Partnership Project; Technical Specification Group Radio Access Network; User Equipment (UE) Radio Transmission and Reception (TDD) (Release 9)," 3GPP TS 25.102 v9.2.0, Sep. 2010, pp. 1-213.

* cited by examiner

METHOD AND ARRANGEMENT IN A CELLULAR COMMUNICATIONS SYSTEM

TECHNICAL FIELD

The present invention relates to the area of wireless communication, and especially to a method and an arrangement for transmission output power control in a cellular telecommunications network.

BACKGROUND

UTRAN (Universal Terrestrial Radio Access Network) is a term that identifies the radio access network of a UMTS (Universal Mobile Telecommunications System), wherein the UTRAN consists of Radio Network Controllers (RNCs) and NodeBs i.e. radio base stations. The NodeBs communicate wirelessly with mobile user equipments (UEs) and the RNCs control the NodeBs. The RNCs are further connected to the Core Network (CN). Evolved UTRAN (E-UTRAN) is an evolution of the UTRAN towards a high-data rate, low-latency and packet-optimised radio access network. Further, the E-UTRAN consists of e-NodeBs (evolved NodeBs), and the e-NodeBs are interconnected and further connected to the Evolved Packet Core network (EPC). E-UTRAN is also being referred to as Long Term Evolution (LTE) and is standardized within the 3$^{rd}$ Generation Partnership Project (3GPP).

In a time multiplexed system, e.g. the uplink in E-UTRAN, HSPA (High Speed Packet Access) or GSM (Global System for Mobile communications) the transmitters transmit in certain assigned timeslots. Thus, a transmitter will start transmitting in the beginning of the timeslot and turn off the transmitter at the end of the timeslot. In addition it is possible that the output power of the transmitter may change from timeslot to timeslot or within a timeslot.

Figure 1:
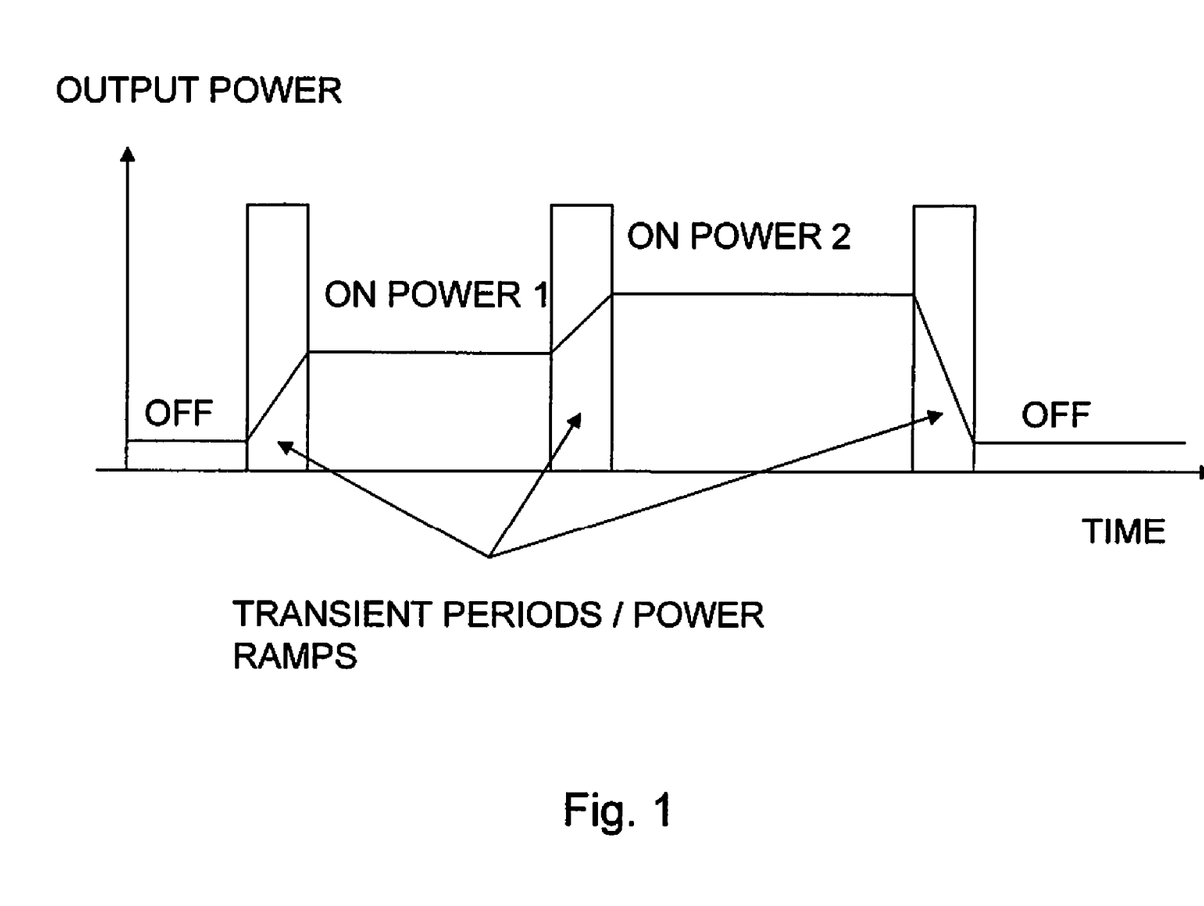
FIG. 1 illustrates the transient periods that occur when output power is changed or the transmitter is turned on or off.

Transmitters typically require some time for turning on the output power as well as turning off the output power. This means that the turning on and off the output power does not occur instantaneously. Furthermore, very sharp transitions between on state and off state would cause unwanted signal emissions in the adjacent carriers causing adjacent channel interference, which should be limited to certain level. Thus, there exists a transient period, i.e. when the transmitter switches from the off state to the on state or vice versa. During these transient periods the output signal of the transmitter is undefined in the sense that the quality of the signal is not as good as when the transmitter is fully turned on. The transient periods are illustrated in FIG. 1. Furthermore, the output power during the transient period is referred to as a power ramp.

Figure 2A:
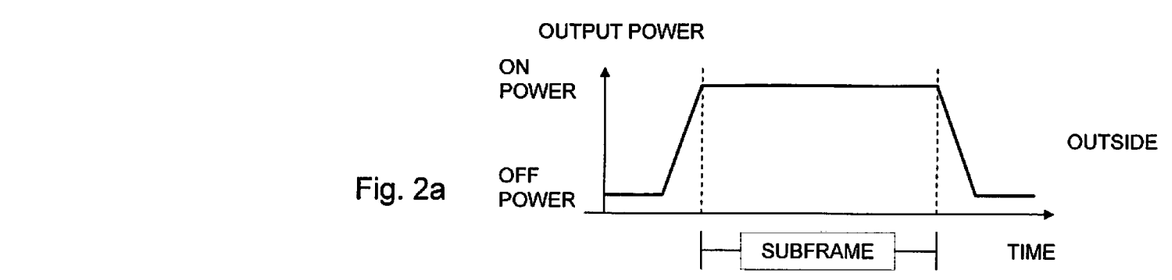
FIGS. 2a, 2b and 2c illustrate possible positions of the power mask ramps.
Figure 2B:
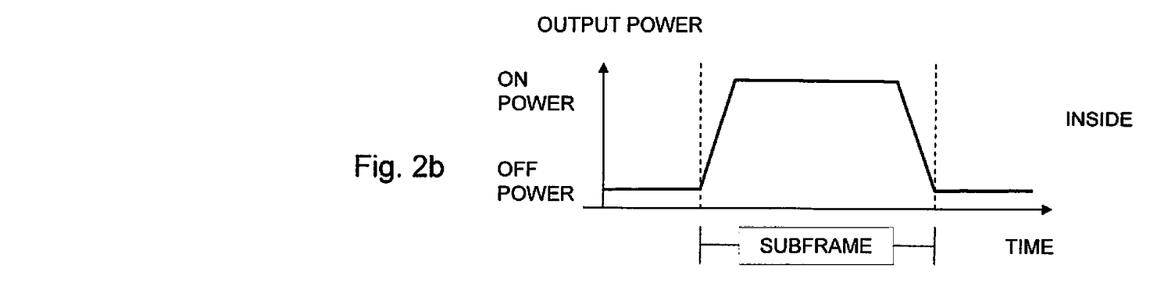
Figure 2C:
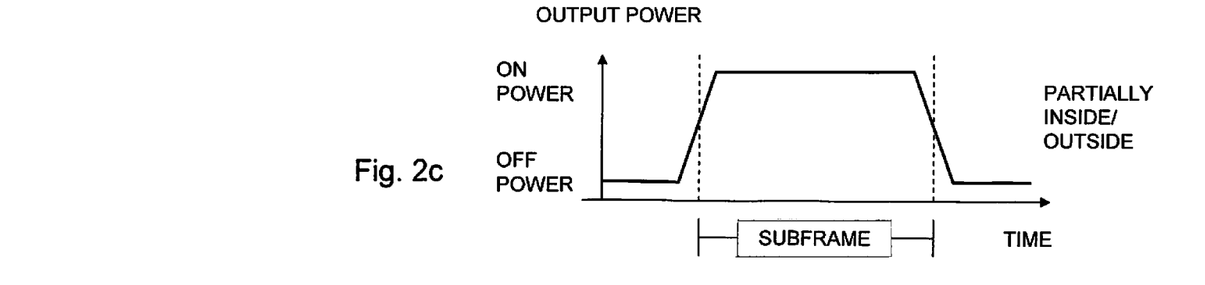

As illustrated in FIG. 1, the duration of the ramping is typically quite short compared to the length of the sub-frame or timeslot but its position has an influence on system performance. In terms of ramping or transient position there are three possibilities:
Ramping outside the timeslot/sub-frame as illustrated in FIG. 2a
Ramping inside the timeslot/sub-frame as illustrated in FIG. 2b
Ramping partly inside and partly outside the timeslot/sub-frame as illustrated in FIG. 2c A power mask, also referred to as a time mask, defines for example the allowed output power at given time instants during a transient event and the time when a ramp starts. For example when the transmitter ramps up, i.e. increases the output power, the power mask may specify how much output power is allowed before the transient event, during the transient event and after the transient event and additionally, when the ramp-up should start. The allowed output power may be expressed as an open range, i.e. below a specific level or as an interval, i.e. between output power X and Y.

It should be noted that in GSM and WCDMA (Wideband Code Division Multiple Access) the power masks are defined in timeslot level (577 µs and 667 µs respectively). In E-UTRAN it will be defined on sub-frame level (1 ms) and SC-OFDM (Single Carrier-Orthogonal Frequency-Division Multiplexing) symbol level, e.g. to be applied when a Sounding Reference Symbol (SRS) is transmitted in the sub-frame.

There are several methods currently in use for avoiding the adverse effects of the ramping periods. In GSM and UTRA-TDD (Universal Terrestrial Radio Access-Time-Division Duplex) the transmitter is turned on slightly before the actual signal is transmitted. In that way the transmitter has some time to reach the on state before the actual signal is transmitted. At the end of the timeslot the transmitter is not turned off until the complete signal has been transmitted. If timeslots are adjacent in time and energy is transmitted outside the timeslot the transmitted energy from one user equipment will cause interference to the signal from another user equipment. To mitigate this problem a tiny guard interval is introduced between the timeslots. In UTRA-FDD (UTRA-Frequency-Division Duplex) this solution is not utilized. The transmitter has not fully reached the on-state when the signal is transmitted and the transmitter is turned off before the transmission of the signal has been completed. In this case the coding and spreading of the signal will mitigate the effects of the ramping period.

In the UTRAN the power control operates on timeslot level. This means that power change occurs on timeslot basis and the transmit power mask is consequently defined on timeslot basis. Moreover, in E-UTRAN the power control operates on sub-frame basis and therefore the transmit power mask is defined on sub-frame level and OFDM symbol level.

Figure 3:
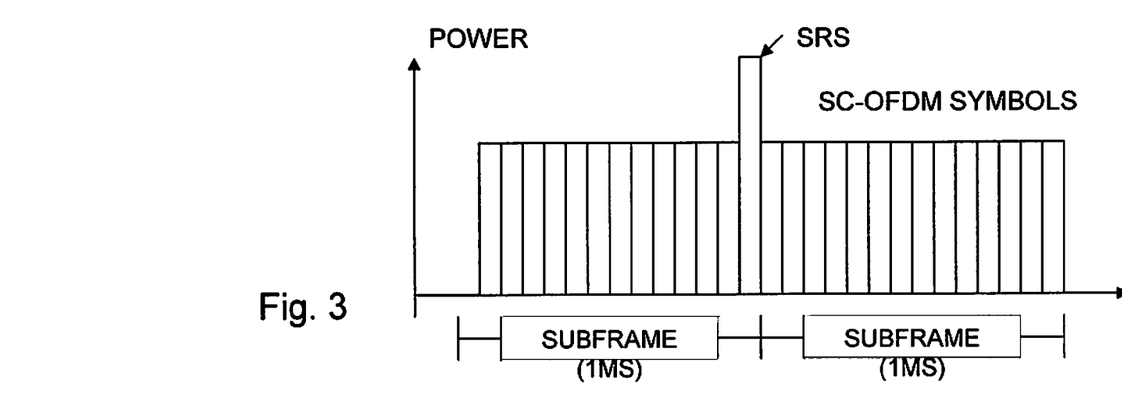
FIG. 3 illustrates an example where uplink sub-frames consist of 14 SC-OFDM symbols.

As mentioned previously, in E-UTRA uplink the duration of a sub-frame is 1 ms. The sub-frame consists of 14 or 12 SC-OFDM symbols. The last symbol in the sub-frame could be used for transmitting the SRS that is used for channel estimation purposes. The SRS can also be used for performing uplink channel dependent scheduling and time tracking. The transmit power for the SRS may differ from the transmit power used for the other symbols of the sub-frame The relationship of the different transmit powers is illustrated in FIG. 3. However, it should be noted that the abrupt power changes shown in FIG. 3 are not possible to implement.

Figure 4:
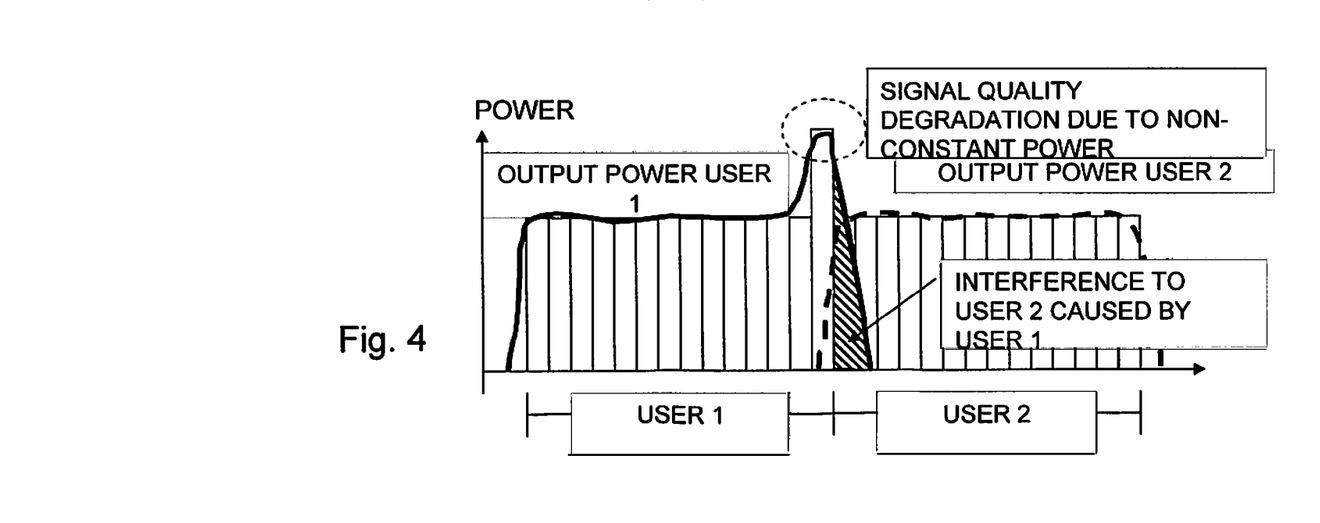
FIG. 4 illustrates problems with signal quality and interference caused by the placement of the power mask ramps.

In the E-UTRAN the uplink timeslots are placed adjacent to each other in time. In the state of the art solution that exists for UTRA, one set of fixed well defined ramped up and down periods are defined in the standard 3GPP TS 25.101 and TS 25.102. Thus, the tradeoff between signal quality and interference to other timeslots is set when the system is designed. FIG. 4 illustrates that placement of power ramps causes problems with signal quality degradation due to non-constant output power and with interference to a user. However, certain signals, e.g. the sounding reference symbol (SRS), need to have good quality especially when they are utilized for uplink channel dependent scheduling. Furthermore, in other situations the interference due to power ramping needs to be minimized in respect to other signals such as data symbols in order to maximize throughput.

Accordingly, there is a need for an improved transmission output power control in the E-UTRAN.

SUMMARY

It is therefore an object of the present invention to provide methods and arrangements for an improved output power management.

In accordance with a first aspect of the present invention a method for transmission output power control in a cellular telecommunications network is provided. In the method a pre-defined power mask for at least one of a sub-frame and an OFDM symbol of a signal transmission is set. The power mask is defined by at least one parameter associated with any of the following:

a starting point of a first power ramp, an ending point of the first power ramp, a starting point of a second power ramp, an ending point of the second power ramp, a first and second duration of the first and second power ramps, respectively, and a first and second power level at a specific time of the first and second power ramps, respectively. Furthermore, in the method at least one of the at least one power mask parameter of the power mask is adapted to a signal transmission characteristic of the signal transmission. Additionally, the adapted power mask is applied to at least one of the sub-frame and the OFDM symbol.

In accordance with a second aspect of the present invention an arrangement for transmission output power control in a cellular telecommunications network is provided. The arrangement comprises a unit for setting a pre-defined power mask for at least one of a sub-frame and an OFDM symbol of a signal transmission. The power mask is defined by at least one parameter associated with any of the following:

a starting point of a first power ramp, an ending point of the first power ramp, a starting point of a second power ramp, an ending point of the second power ramp, a first and second duration of the first and second power ramps, respectively, and a first and second power level at a specific time of the first and second power ramps, respectively. Furthermore, the arrangement comprises a unit for adapting at least one of the at least one power mask parameter of the power mask to a signal transmission characteristic of the signal transmission. Additionally, the arrangement comprises a unit for applying the adapted power mask to at least one of the sub-frame and the OFDM symbol.

An advantage with the present invention is the possibility to signal certain transmission signals, i.e. the reference signal, from a user with a high quality, while at the same time it is possible to minimize the interference to and from other users. Thus, the throughput of the system can be kept high.

Another advantage with the present invention is the possibility to differentiate the quality of a service for different users.

BRIEF DESCRIPTION OF THE DRAWINGS

For a better understanding, reference is made to the following drawings and preferred embodiments of the invention.

DETAILED DESCRIPTION

In the following description, for purposes of explanation and not limitation, specific details are set forth, such as particular sequences of steps, signaling protocols and device configurations in order to provide a thorough understanding of the present invention. It will be apparent to one skilled in the art that the present invention may be practised in other embodiments that depart from these specific details.

Moreover, those skilled in the art will appreciate that the means and functions explained herein below may be implemented using software functioning in conjunction with a programmed microprocessor or general purpose computer, and/or using an application specific integrated circuit (ASIC). It will also be appreciated that while the current invention is primarily described in the form of methods and devices, the invention may also be embodied in a computer program product as well as a system comprising a computer processor and a memory coupled to the processor, wherein the memory is encoded with one or more programs that may perform the functions disclosed herein.

Figure 5:
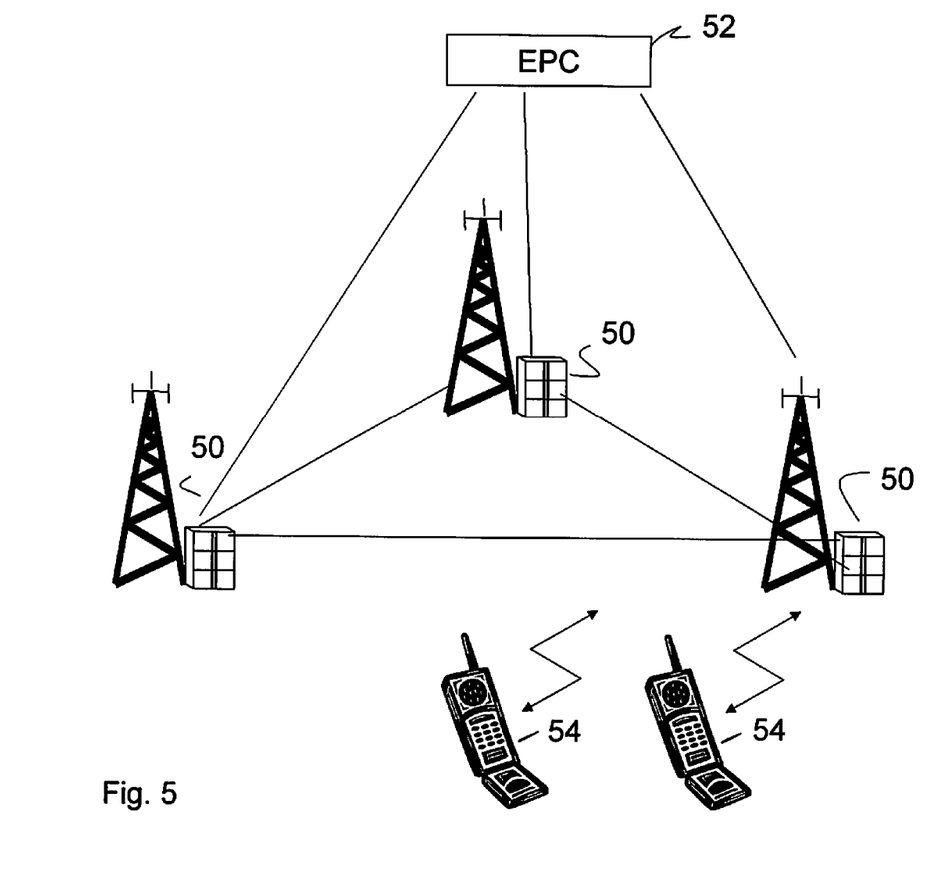
FIG. 5 shows the general architecture of a third generation cellular telecommunications network and its evolutions, wherein the present invention may be implemented.

The general architecture of a third generation cellular telecommunications network and its evolutions is illustrated in FIG. 5, wherein the present invention may be implemented. The telecommunications network is widely deployed to provide a variety of communication services such as voice and packet data. As illustrated in FIG. 5, the cellular telecommunications network may include one or more eNodeBs 50 connected to a core network EPC 52, and a plurality of user equipments (UEs) 54 may be located in one cell. As stated above there is a need for an improved transmission output power control in the E-UTRAN. Thus, the present invention comprises methods and arrangements for transmission output power control in a cellular telecommunications network as illustrated in FIG. 5. The improved transmission output power control is achieved according to an embodiment by adapting a pre-defined power mask to a signal transmission characteristic of the signal transmission, i.e. content of the signal to be transmitted, and applying the adapted power mask to a sub-frame or an OFDM symbol. The method could further be implemented in a network node such as an eNodeB or in a UE.

Figure 6A:
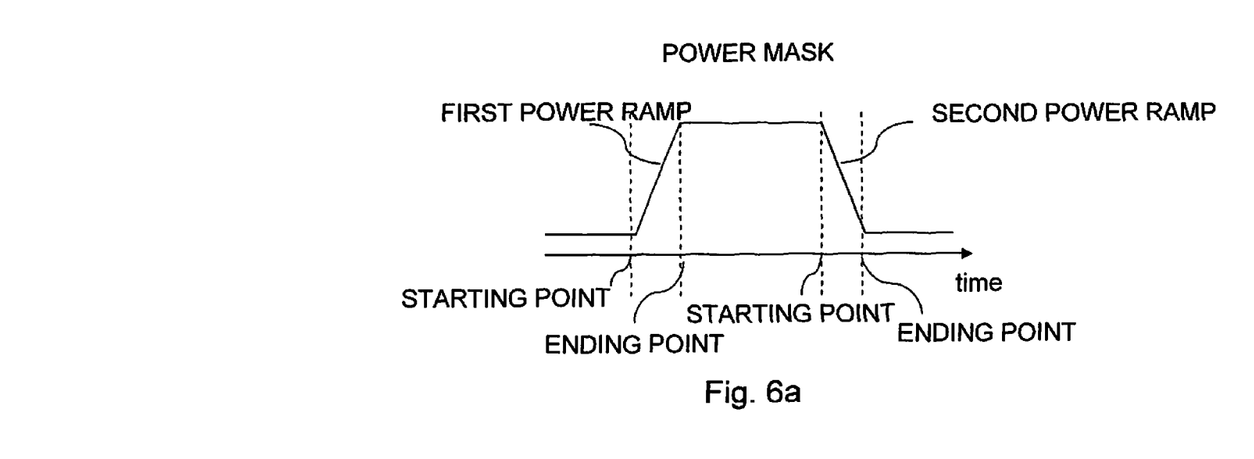
FIGS. 6a and 6b show a power mask and different power mask parameters.
Figure 6B:
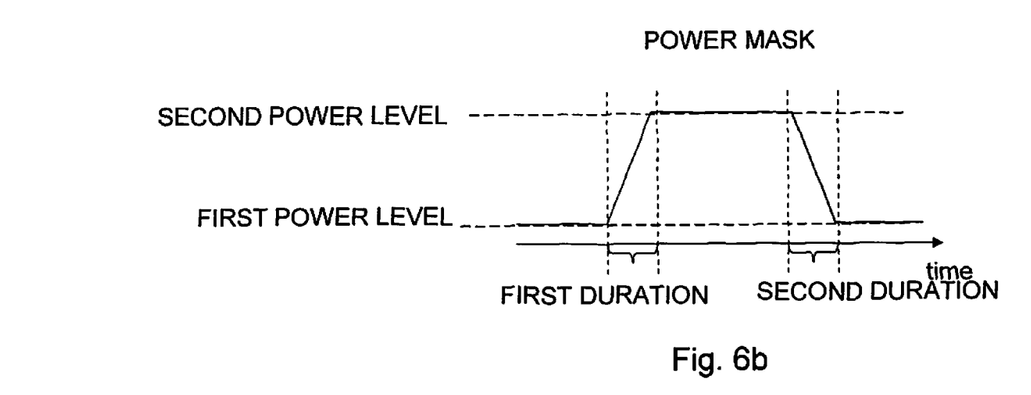

A power mask is the transient period of the transmission power between transmit OFF and ON power and between transmit ON and OFF power and is defined by one or several power mask parameters. An example of a power mask is shown in FIG. 6a. The power mask comprises a first power ramp and a second power ramp. The first power ramp has a starting point and an ending point. In addition, the second power ramp has a starting point and an ending point. As further shown in FIG. 6b, the power mask is defined by duration of the first power ramp and duration of the second power ramp in this example. The power mask could further be defined by a first power level and a second power level at a specific time of the ramps.

We now turn to FIGS. 7-11 which show flowcharts of the methods and schematically block diagrams of the arrangements according to embodiments of the present invention.

Figure 7A:
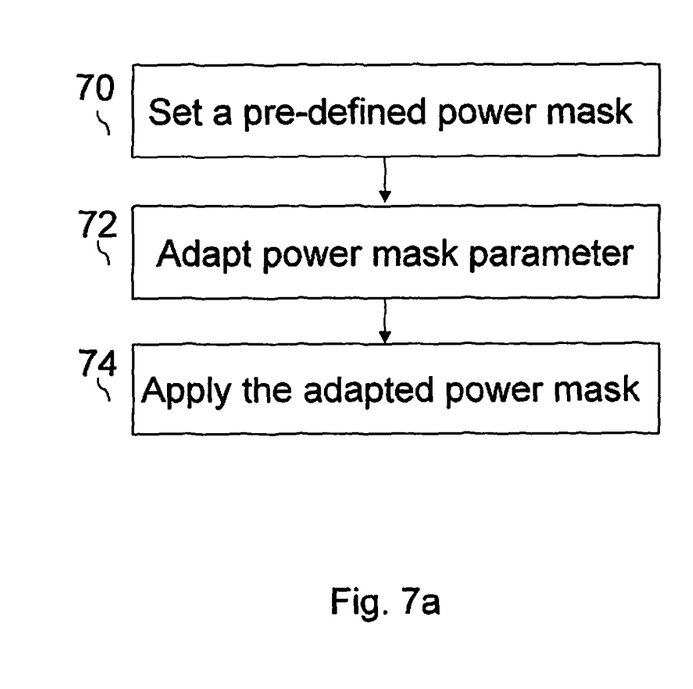
FIG. 7a is a flowchart illustrating the method of the present invention and 7b is a flowchart illustrating an embodiment of the present invention.

FIG. 7a illustrates a flowchart showing a method according to a first embodiment of the present invention where a pre-defined power mask is set 70 for a sub-frame or an OFDM symbol of a signal transmission to be applied in the signal transmission. This may be done by using a pre-defined power mask. Such pre-defined power mask is defined by one or several power mask parameters as previously mentioned. One or several power mask parameters are then adapted 72 to a signal transmission characteristic of the signal transmission. The present invention provides the possibility to adapt the power mask parameters according to one or more of a plurality of signal transmission characteristics such as content of the signal to be transmitted in the sub-frame or OFDM symbol content of the signal to be transmitted in the successive sub-frame or OFDM symbol given conditions, e.g. traffic load network configuration, e.g. using reference signal based measurements for special purpose like scheduling, link adaptation and time tracking deployment scenarios, e.g. cell size.

Furthermore, the adapted power mask is then applied 74 to the sub-frame or the OFDM symbol when the sub-frame or OFDM symbol is transmitted. Hence, the change in the output power, i.e. the time instant to turn on or off a transmitter which transmits the signal on which the power mask is applied, and thus the position of the ramp of the power mask, is determined by a single or a combination of the signal transmission characteristics. The adaptation of the pre-defined power mask can be realized in different ways, e.g. as standardized rules or by configuration via signaling.

Figure 8:
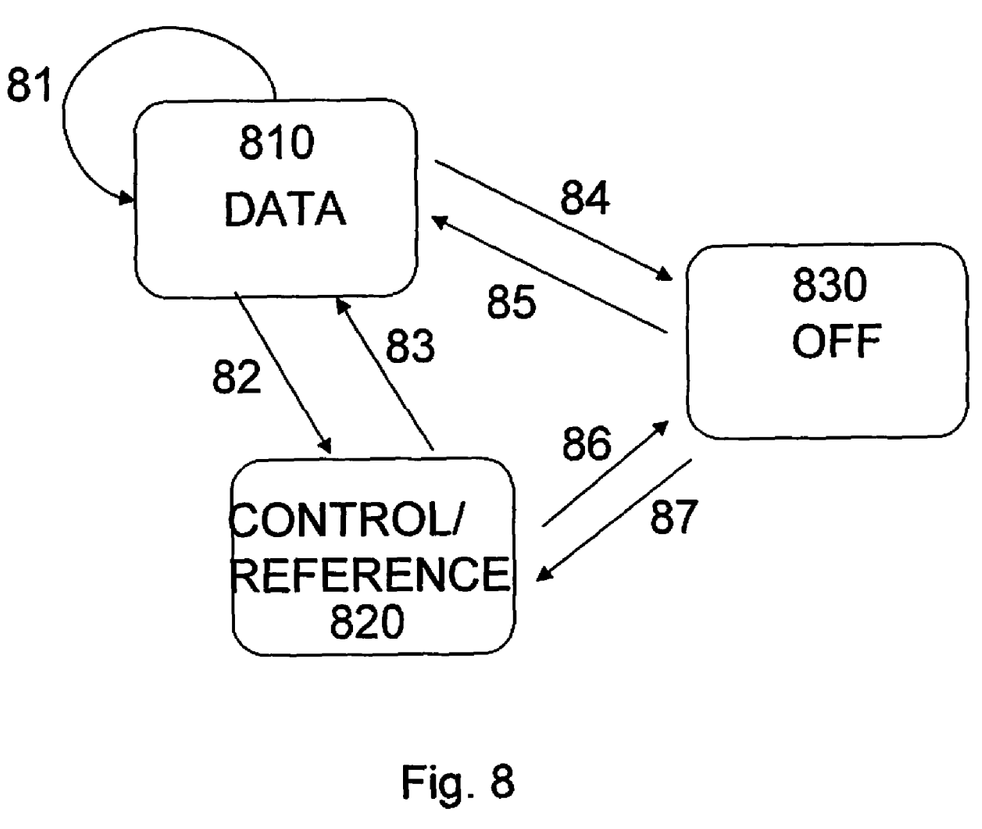
FIG. 8 shows an example of a set of rules for how to adapt the power mask parameters according to an embodiment of the present invention.

The standardized rules are utilized in order to determine when to start or end the ramp as well as the duration of the ramp. In FIG. 8 an example of a set of rules for how to adapt the power mask parameter is illustrated. Each arrow 81-87 represents a rule. Depending on what sub-frame or symbol has been sent and what sub-frame or symbol to transmit next a specific rule is selected. A first state box 810 represents the signal transmission characteristic of the signal transmission when a sub-frame or symbol contains data. A second state box 820 represents the signal transmission characteristic of the signal transmission when the content of a sub-frame or symbol is a control or reference symbol. A third state box 830 represents the signal transmission characteristic of the signal transmission when a sub-frame or symbol contains no data. For example this could be when the UE is in an OFF state. It should be noted that the UE can be in both idle mode and connected mode in the OFF state. The signal transmission characteristic of the signal transmission could also be a transition from one sub-frame or symbol to a successive sub-frame or symbol. Each rule is associated with one or several parameters of the power mask ramps, i.e. the starting point, the ending point and duration. The power mask parameters may be defined in the standard or be signaled by the core network 52, as illustrated in FIG. 5.

Figure 9A:
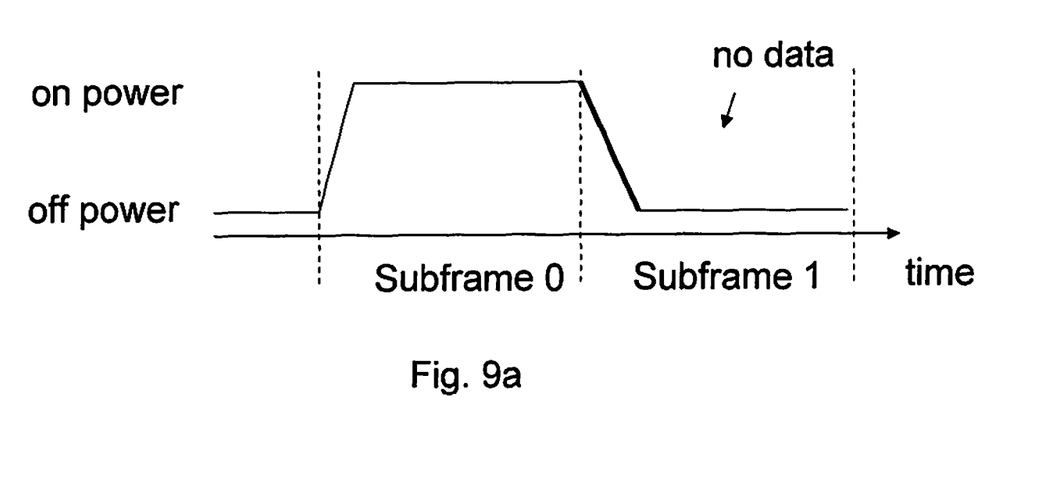
FIGS. 9a, 9b, 9c, 9d and 9e illustrates example of how the power mask parameters could be adapted according to an embodiment of the present invention.
Figure 9B:
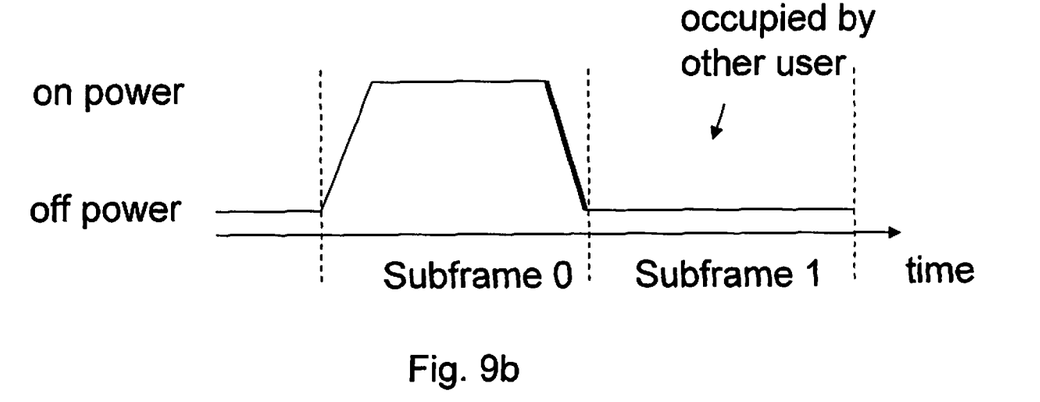

The adaptation of the power mask parameters may also be determined by signal transmission characteristic of the signal transmission such as network configuration, e.g. scheduling information. One example is the scheduling information sent in a cell by the base station i.e. the eNodeB. In E-UTRAN scheduling information is sent on PDCCH (Physical Downlink Control Channel). Every UE is supposed to listen to the scheduling information sent on PDCCH since any UE in the cell can be scheduled for uplink transmission in any sub-frame. The scheduling information indicates which sub-frames are used and which ones are not. By listening to the scheduling information the UE can determine if the sub-frame following the sub-frame the UE is scheduled for, i.e. the successive sub-frame, will be used by another UE or not. The UE can then adapt the position of the ramp based on this information. Moreover, in order to maximize signal quality, when a successive sub-frame of the sub-frame to be transmitted does not contain data, the rule 84 could imply that the adapting of the power mask parameter is performed by adjusting the starting point parameter of the second power ramp to be placed outside the sub-frame as shown in FIG. 9a. In order to minimize interference, when a successive sub-frame of the sub-frame to be transmitted contains data, the rule 85 could imply that the adapting of the power mask parameter is performed by adjusting the ending point parameter of the second power ramp to be placed inside the sub-frame as shown in FIG. 9b.

Figure 9C:
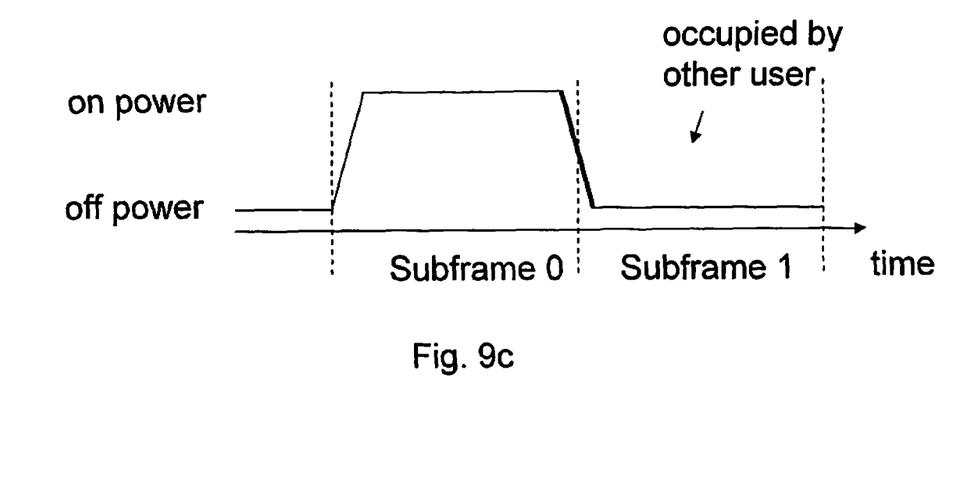

When the sub-frame contains data and a successive sub-frame of the sub-frame to be transmitted contains data, the rule 81 comprises the adapting of the power mask parameter performed by adjusting the starting point parameter of the second power ramp to be placed inside the sub-frame and by adjusting the ending point parameter of the second power ramp to be placed outside the sub-frame and by shortening the duration of the second power ramp as illustrated in FIG. 9c.

Figure 9D:
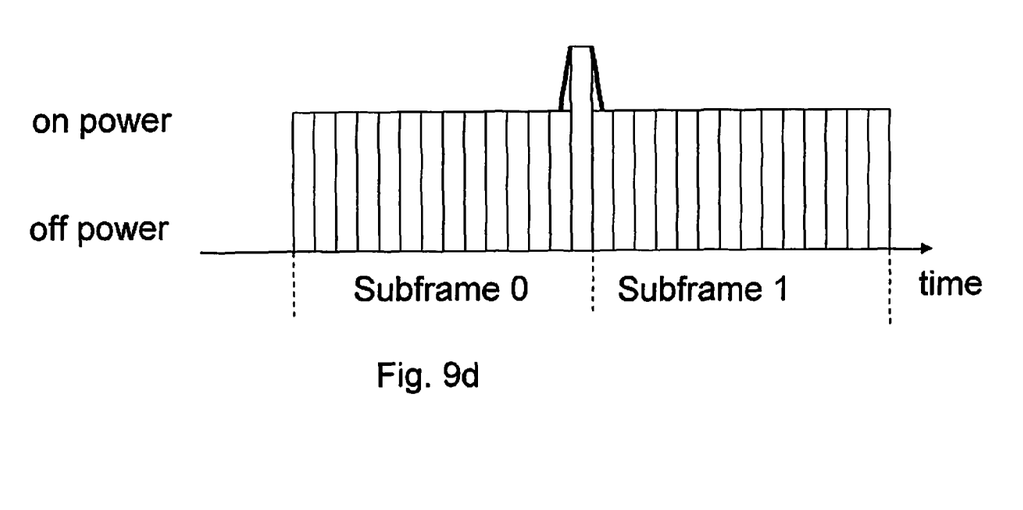

Yet a further example is when the OFDM symbol to be transmitted contains a reference signal, the rule 83, 86 comprises the adapting of the power mask parameter performed by adjusting the ending point parameter of the first power ramp to be placed outside the OFDM symbol and by adjusting the starting point parameter of the second power ramp to be placed outside the OFDM symbol as illustrated in FIG. 9d.

Figure 9E:
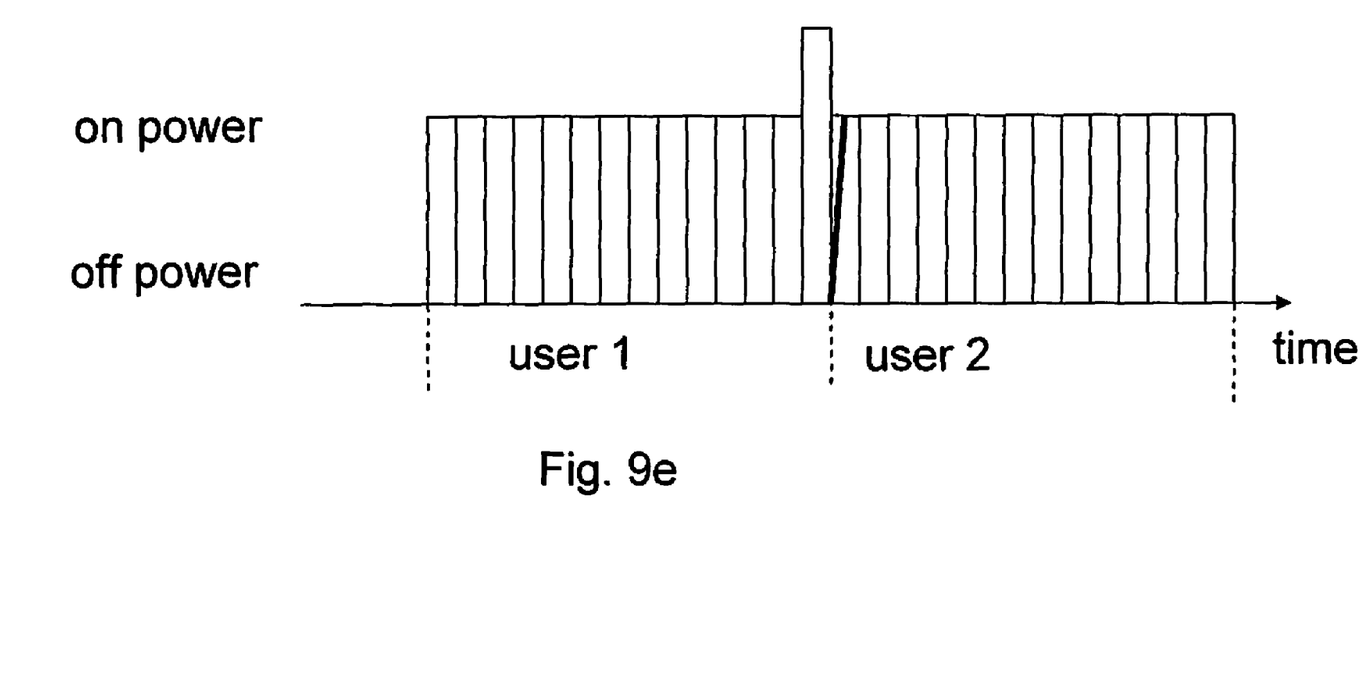

Yet a further example is when a preceding OFDM symbol of the OFDM symbol to be transmitted contains a reference signal, the rule 83, 86 comprises the adapting of the power mask parameter performed by adjusting the starting point parameter of the first power ramp to be placed inside the OFDM symbol as shown in FIG. 9e.

Yet a further example is when a successive OFDM symbol of the OFDM symbol to be transmitted contains a reference signal, the rule 82, 87 comprises the adapting of the power mask parameter performed by adjusting the ending point parameter of the second power ramp to be placed inside the OFDM symbol.

A further example is when a successive sub-frame of the sub-frame to be transmitted contains data with high order modulation, e.g. 16 QAM (Quadrature Amplitude Modulation) or 64 QAM or higher. The rule comprises the adapting of the power mask parameter performed by adjusting the ending point parameter of the second power ramp to be placed inside the sub-frame. Additionally, when a successive sub-frame of the sub-frame to be transmitted contains data with low order modulation, e.g. BPSK (Binary Phase-Shift Keying) or QPSK (Quadrature PSK), the rule comprises the adapting of the power mask parameter performed by adjusting the starting point parameter of the second power ramp to be placed outside the sub-frame.

Moreover, in an embodiment of the invention a threshold value of the signal disturbance during the signal transmission could be determined. Moreover, when the signal is strong and the signal disturbance is lower or equal to the pre-determined threshold value, the rule comprises the adapting of the power mask parameter performed by adjusting the ending point parameter of the first power ramp to be placed outside the sub-frame and by adjusting the starting point parameter of the second power ramp to be placed outside the sub-frame. Additionally, when the signal is weak and the signal disturbance is greater than the pre-determined threshold value, the rule comprises the adapting of the power mask parameter performed by adjusting the starting point parameter of the first power ramp to be placed inside the sub-frame and by adjusting the ending point parameter of the second power ramp to be placed inside the sub-frame.

It should be mentioned that the same or similar rules can be applied by the method implemented in the eNodeB. Each eNodeB schedules the UEs connected to the eNodeB. Furthermore, as the eNodeBs are interconnected they can exchange scheduling information. Consequently, the eNodeBs can exchange information regarding whether a sub-frame will be scheduled or not.

Therefore eNodeB in principle could identify if the successive sub-frame is used or not used by another eNodeB. This is because the eNodeBs are interconnected and they can exchange via eNode B-eNode B interface, the scheduling information or at least information regarding whether successive sub-frame will be scheduled or not. The eNodeB knows if the successive sub-frame is used or not used by another eNodeB as the eNodeBs are interconnected.

As mentioned previously, the adaptation of the pre-defined power mask can be realized by dynamic configuration via signaling. A power mask utilized by a base station, i.e. an eNodeB, can be dynamically configured internally in the base station. In systems like UTRAN, the RNC could configure the base station power mask via signaling over an interface between the RNC and the NodeB i.e. Iub.

Figure 7B:
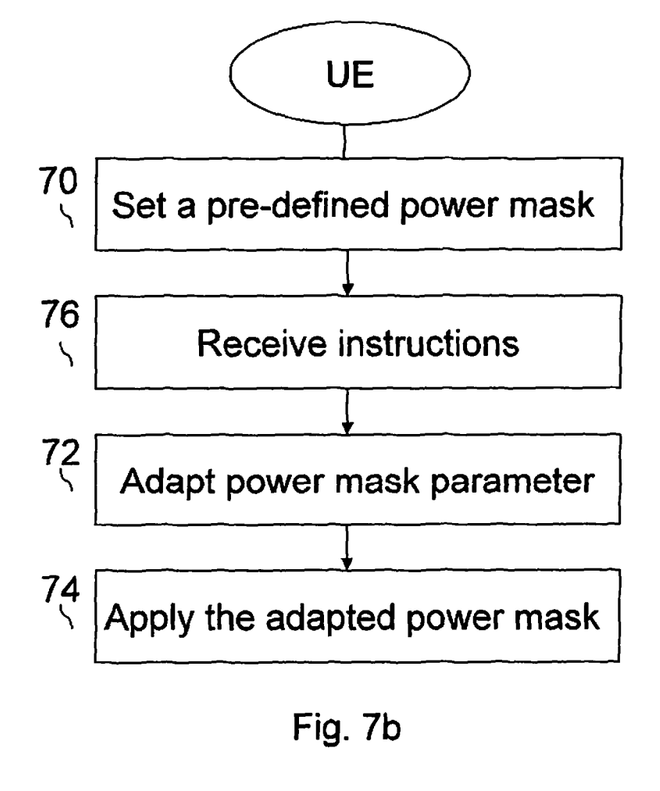

However, the adaptation of the power mask utilized in the UE may also be based on explicit radio interface signaling. The signaling can be sent via a broadcast channel from the eNodeB in case the same adapted power mask is to be used by all UEs in a cell with certain signal transmission characteristics e.g. a certain power mask in a large cell. Alternatively, each UE can be individually configured to transmit according to a certain power mask via RRC (Radio Resource Control) or MAC (Media Access Control) signaling. FIG. 7b illustrates an embodiment of the present invention implemented in the UE 54, wherein the UE 54 receives instructions 76 from the eNodeB on how to adapt the pre-defined power mask. An advantage with the embodiment is that the power consumption of the UE 54 is reduced since the calculations of how to adapt the power mask is executed in the eNodeB. Another advantage with the embodiment is that the system performance can be maximised due to the fact that the eNodeB has more information about the system state, e.g. queue lengths, radio conditions, than the UE.

There are different ways to configure the power mask utilized in the UE via signaling. In one embodiment the eNodeB signals the exact time offset from the edge of the sub-frame or the OFDM symbol. In another embodiment the eNodeB signals that either all ramps start at the end or at the beginning of the sub-frame or the OFDM symbol. Yet in another embodiment the eNodeB signals the identifier of an adapted power mask of a plurality of specified and well defined adapted power masks to the UE, i.e. an identity of a standardized power mask out of plurality of standardized power masks. In all the above cases the power mask utilized by the UE is dynamically or semi-statically configured and controlled by the eNodeB.

Figure 10:
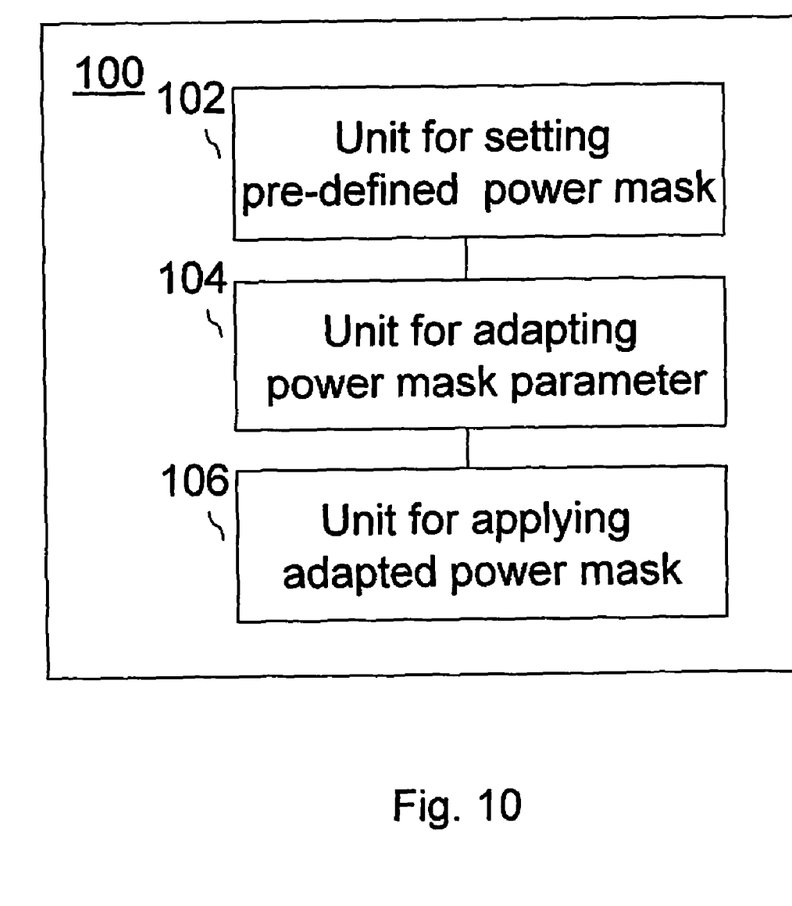
FIG. 10 shows a block diagram schematically illustrating an arrangement in accordance with an embodiment of the present invention.

The method shown in FIG. 7a may be implemented in an arrangement illustrated in FIG. 10. The arrangement 100 comprises a unit for setting 102 a pre-defined power mask for a sub-frame or an OFDM symbol of a signal transmission. The arrangement 100 further comprises a unit for adapting 104 at least one of the power mask parameters of the power mask to a signal transmission characteristic of the signal transmission, and a unit for applying 106 the adapted power mask to the sub-frame or the OFDM symbol. The unit for adapting 104 the power mask parameter is configured to adjust the power mask parameters in accordance with the method of the present invention described previously.

Figure 11:
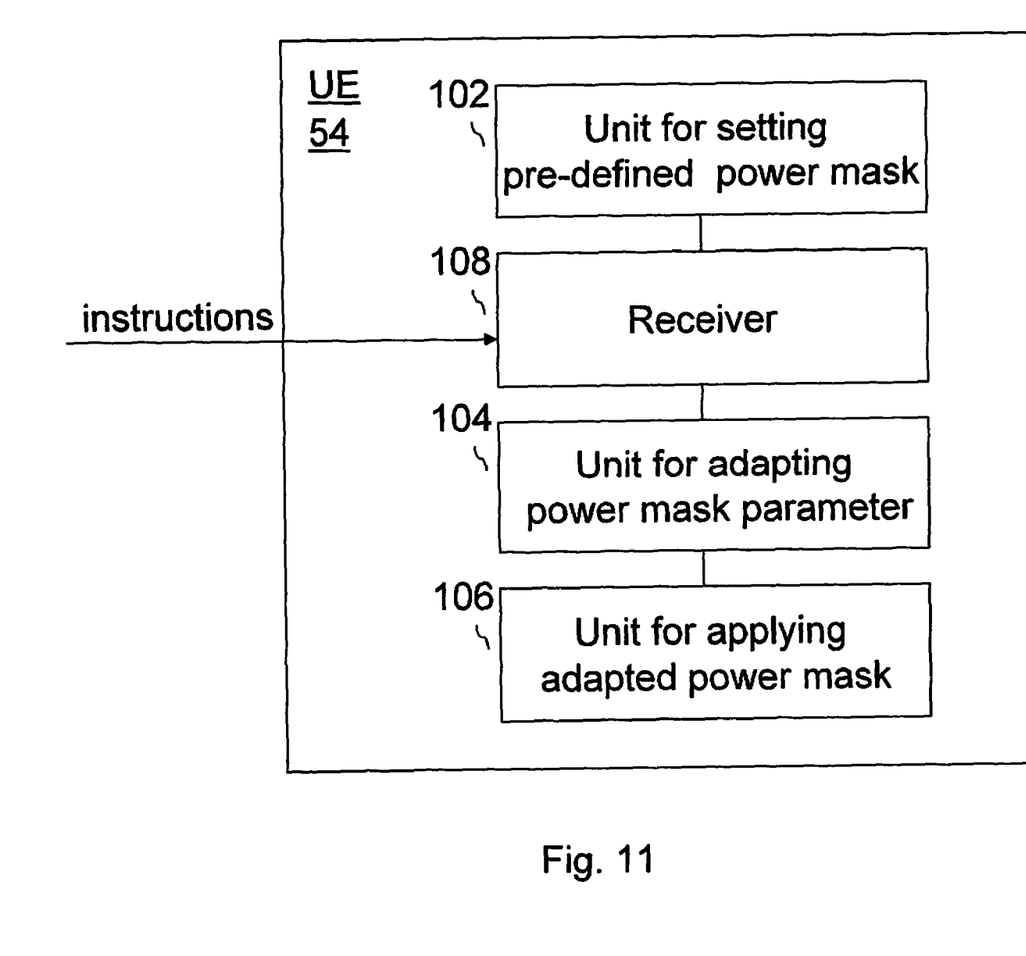
FIG. 11 shows a block diagram schematically illustrating an arrangement implemented in a UE in accordance with an embodiment of the present invention.

Moreover, the arrangement 100 could be implemented in a UE 54 or an eNodeB 50. In one embodiment of the present invention the arrangement is implemented in a UE 54 as shown in FIG. 11. The arrangement could further comprise a receiver 108 for receiving instructions on how to adapt the power mask parameters from the eNodeB 50.

The present invention may, of course, be carried out in other ways than those specifically set forth herein without departing from essential characteristics of the invention. The present embodiments are to be considered in all respects as illustrative and not restrictive.

The invention claimed is:

1. A method for transmission output power control in a transmitter for use in cellular telecommunications comprising: setting a pre-defined power mask for at least one of a sub-frame and an Orthogonal Frequency-Division Multiplexing, OFDM, symbol of a signal transmission, wherein the power mask is defined by at least one parameter associated with one or more of the following: a starting point of a first power ramp, an ending point of the first power ramp, a starting point of a second power ramp, and an ending point of the second power ramp, wherein the method comprises the steps of:

adapting at least one of the at least one power mask parameter of the power mask to a signal transmission characteristic of the signal transmission such that depending upon the signal transmission characteristic said first and/or second power ramps are placed either inside or outside the subframe or OFDM symbol, and wherein said transmission characterisic relates to whether any reference symbols will be transmitted in the subframe or OFDM symbol and/or whether any reference symbols will be transmitted in a successive subframe or OFDM symbol, and applying the adapted power mask to at least one of the sub-frame and the OFDM symbol.

2. The method according to claim 1, wherein the method is implemented in a user equipment.

3. The method according to claim 2, comprising the step of receiving instruction on how to adapt the at least one of the at least one power mask parameter from a network node.

4. The method according to claim 3, wherein the instruction comprises an identity of one out of a plurality of standardized power masks.

5. The method according to claim 1, wherein the method is implemented in a network node.

6. The method according to claim 1, wherein the adapting of the power mask parameter is performed by adjusting the ending point parameter of the second power ramp to be placed inside said sub-frame when a successive sub-frame of said sub-frame contains data.

7. The method according to claim 1, wherein the adapting of the power mask parameter is performed by adjusting the starting point parameter of the second power ramp to be placed outside said sub-frame when a successive sub-frame of said sub-frame does not contain data.

8. The method according to claim 1, wherein the adapting of the power mask parameter is performed by adjusting the starting point parameter of the second power ramp to be placed inside said sub-frame and by adjusting the ending point parameter of the second power ramp to be placed outside said sub-frame and by shortening the duration of the second power ramp when said sub-frame contains data and a successive sub-frame of said sub-frame contains data.

9. The method according to claim 1, wherein the adapting of the power mask parameter is performed by adjusting the ending point parameter of the first power ramp to be placed outside said OFDM symbol and by adjusting the starting point parameter of the second power ramp to be placed outside said OFDM symbol when said OFDM symbol contains a reference signal.

10. The method according to claim 1, wherein the adapting of the power mask parameter is performed by adjusting the starting point parameter of the first power ramp to be placed inside said OFDM symbol when a preceding OFDM symbol of said OFDM symbol contains a reference signal.

11. The method according to claim 1, wherein the adapting of the power mask parameter is performed by adjusting the ending point parameter of the second power ramp to be placed inside said OFDM symbol when a successive OFDM symbol of said OFDM symbol contains a reference signal.

12. The method according to claim 1, wherein the adapting of the power mask parameter is performed by adjusting the ending point parameter of the second power ramp to be placed inside said sub-frame when a successive sub-frame of said sub-frame contains data with high order modulation.

13. The method according to claim 1, wherein the adapting of the power mask parameter is performed by adjusting the starting point parameter of the second power ramp to be placed outside said sub-frame when a successive sub-frame of said sub-frame contains data with low order modulation.

14. The method according to claim 1, wherein the adapting of the power mask parameter is performed by adjusting the ending point parameter of the first power ramp to be placed outside said sub-frame and by adjusting the starting point parameter of the second power ramp to be placed outside said sub-frame when a signal disturbance is lower or equal to a pre-determined threshold value.

15. The method according to claim 1, wherein the adapting of the power mask parameter is performed by adjusting the starting point parameter of the first power ramp to be placed inside said sub-frame and by adjusting the ending point parameter of the second power ramp to be placed inside said sub-frame when a signal disturbance is greater than a pre-determined threshold value.

16. Arrangement for transmission output power control in a transmitter for use in cellular telecommunications comprising:
   a unit for setting a pre-defined power mask for at least one of a sub-frame and an Orthogonal Frequency-Division Multiplexing, OFDM, symbol of a signal transmission, wherein the power mask is defined by at least one parameter associated with one or more of the following: a starting point of a first power ramp, an ending point of the first power ramp, a starting point of a second power ramp, and an ending point of the second power ramp, wherein the arrangement comprises:
   a unit for adapting at least one of the at least one power mask parameter of the power mask to a signal transmission characteristic of the signal transmission, such that depending upon the transmission characteristic said first and/or second power ramps are placed either inside or outside the subframe or OFDM symbol, and wherein said transmission characteristic relates to whether any reference symbols will be transmitted in the subframe or OFDM symbol and/or whether any reference symbols will be transmitted in a successive subframe or OFDM symbol, and
   a unit for applying the adapted power mask to at least one of the sub-frame and the OFDM symbol.

17. The arrangement according to claim 16, wherein the arrangement is implemented in a user equipment.

18. The arrangement according to claim 17, comprising a receiver for receiving instruction on how to adapt the at least one of the at least one power mask parameter from a network node.

19. The arrangement according to claim 18, wherein the instruction comprises an identity of one out of a plurality of standardized power masks.

20. The arrangement according to claim 16, wherein the arrangement is implemented in a network node.

21. The arrangement according to claim 16, wherein the unit for adapting is configured to adjust the ending point parameter of the second power ramp to be placed inside said sub-frame when a successive sub-frame of said sub-frame contains data.

22. The arrangement according to claim 16, wherein the unit for adapting is configured to adjust the starting point parameter of the second power ramp to be placed outside said sub-frame when a successive sub-frame of said sub-frame does not contain data.

23. The arrangement according to claim 16, wherein the unit for adapting is configured to adjust the starting point parameter of the second power ramp to be placed inside said sub-frame and to adjust the ending point parameter of the second power ramp to be placed outside said sub-frame and to shorten the duration of the second power ramp when said sub-frame contains data and a successive sub-frame of said sub-frame contains data.

24. The arrangement according to claim 16, wherein the unit for adapting is configured to adjust the ending point parameter of the first power ramp to be placed outside said OFDM symbol and to adjust the starting point parameter of the second power ramp to be placed outside said OFDM symbol when said OFDM symbol contains a reference signal.

25. The arrangement according to claim 16, wherein the unit for adapting is configured to adjust the starting point parameter of the first power ramp to be placed inside said OFDM symbol when a preceding OFDM symbol of said OFDM symbol contains a reference signal.

26. The arrangement according to claim 16, wherein the unit for adapting is configured to adjust the ending point parameter of the second power ramp to be placed inside said OFDM symbol when a successive OFDM symbol of said OFDM symbol contains a reference signal.

27. The arrangement according to claim 16, wherein the unit for adapting is configured to adjust the ending point parameter of the second power ramp to be placed inside said sub-frame when a successive sub-frame of said sub-frame contains data with high order modulation.

28. The arrangement according to claim 16, wherein the unit for adapting is configured to adjust the starting point parameter of the second power ramp to be placed outside said sub-frame when a successive sub-frame of said sub-frame contains data with low order modulation.

29. The arrangement according to claim 16, wherein the unit for adapting is configured to adjust the ending point parameter of the first power ramp to be placed outside said sub-frame and to adjust the starting point parameter of the second power ramp to be placed outside said sub-frame when a signal disturbance is lower or equal to a pre-determined threshold value.

30. The arrangement according to claim 16, wherein the unit for adapting is configured to adjust the starting point parameter of the first power ramp to be placed inside said sub-frame and to adjust the ending point parameter of the second power ramp to be placed inside said sub-frame when a signal disturbance is greater than a pre-determined threshold value.

* * * * *